United States Patent
Paul et al.

(10) Patent No.: US 10,950,610 B2
(45) Date of Patent: Mar. 16, 2021

(54) ASYMMETRIC GATE CUT ISOLATION FOR SRAM

(71) Applicant: GLOBALFOUNDRIES U.S. Inc., Santa Clara, CA (US)

(72) Inventors: Bipul C. Paul, Mechanicville, NY (US); Ruilong Xie, Niskayuna, NY (US); Julien Frougier, Albany, NY (US); Daniel Chanemougame, Niskayuna, NY (US); Hui Zang, Guilderland, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/515,913

(22) Filed: Jul. 18, 2019

(65) Prior Publication Data
US 2021/0020644 A1    Jan. 21, 2021

(51) Int. Cl.
*H01L 27/11* (2006.01)
*H01L 21/8238* (2006.01)
(Continued)

(52) U.S. Cl.
CPC .... *H01L 27/1108* (2013.01); *H01L 21/02532* (2013.01); *H01L 21/02603* (2013.01);
(Continued)

(58) Field of Classification Search
None
See application file for complete search history.

(56) References Cited

U.S. PATENT DOCUMENTS

| 6,017,496 A | 1/2000 | Nova et al. |
| 6,100,026 A | 8/2000 | Nova et al. |

(Continued)

FOREIGN PATENT DOCUMENTS

GB    2510716 A    8/2014

OTHER PUBLICATIONS

Guo et al. ("Guo" Guo, Z. "FinFET-Based SRAM Design" ISLPED '05 Proc. Of 2005 Int. Symp. On Low Pow. Elec. And Des. Oct. 24, 2005 pp. 2-7 (Year: 2005).*

(Continued)

*Primary Examiner* — Grant S Withers
(74) *Attorney, Agent, or Firm* — Francois Pagette; Hoffman Warnick LLC

(57) ABSTRACT

Methods of forming a gate cut isolation for an SRAM include forming a first and second active nanostructures adjacent to each other and separated by a space; forming a sacrificial liner over at least a side of the first active nanostructure facing the space, causing a first distance between a remaining portion of the space and the first active nanostructure to be greater than a second distance between the remaining portion of the space and the second active nanostructure. A gate cut isolation is formed in the remaining portion of the space such that it is closer to the second active nanostructure than the first active nanostructure. The sacrificial liner is removed, and gates formed over the active nanostructures with the gates separated from each other by the gate cut isolation. An SRAM including the gate cut isolation and an IC structure including the SRAM are also included.

10 Claims, 15 Drawing Sheets

(51) Int. Cl.

| | |
|---|---|
| *H01L 29/06* | (2006.01) |
| *H01L 29/423* | (2006.01) |
| *H01L 29/49* | (2006.01) |
| *H01L 29/786* | (2006.01) |
| *H01L 29/66* | (2006.01) |
| *H01L 21/02* | (2006.01) |
| *H01L 21/28* | (2006.01) |
| *H01L 27/092* | (2006.01) |

(52) U.S. Cl.
CPC .. *H01L 21/28088* (2013.01); *H01L 21/28123* (2013.01); *H01L 21/823807* (2013.01); *H01L 21/823842* (2013.01); *H01L 21/823878* (2013.01); *H01L 27/092* (2013.01); *H01L 27/1116* (2013.01); *H01L 29/0649* (2013.01); *H01L 29/0673* (2013.01); *H01L 29/42392* (2013.01); *H01L 29/4908* (2013.01); *H01L 29/66545* (2013.01); *H01L 29/78696* (2013.01)

(56) References Cited

U.S. PATENT DOCUMENTS

| | | |
|---|---|---|
| 6,284,459 B1 | 9/2001 | Nova et al. |
| 6,319,668 B1 | 11/2001 | Nova et al. |
| 9,653,289 B1 | 5/2017 | Balakrishnan et al. |
| 10,074,727 B2 | 9/2018 | Adusumilli et al. |
| 10,103,065 B1 | 10/2018 | Mochizuki et al. |
| 2016/0233298 A1 | 8/2016 | Webb et al. |
| 2017/0084756 A1 | 3/2017 | Cheng et al. |
| 2017/0133459 A1 | 5/2017 | Pranatharthiharan et al. |
| 2018/0342427 A1 | 11/2018 | Xie et al. |
| 2018/0350695 A1 | 12/2018 | Cheng et al. |
| 2019/0386002 A1* | 12/2019 | Wu ................ H01L 21/823431 |
| 2020/0051980 A1* | 2/2020 | Liaw ............... H01L 21/823821 |

OTHER PUBLICATIONS

Lapedus Article ("Big trouble At 3nm" Semiconductor Engineering article available online Jun. 21, 2018 at https://web.archive.org/web/20180621213110/https://semiengineering.com/big-trouble-at-3nm/) (Year: 2018).*
Office Action for corresponding TW Patent Application No. 108122168 dated Mar. 19, 2020, 4 pages.
Search Report for corresponding TW Patent Application No. 108122168 dated Mar. 19, 2020, 1 page.
U.S. Appl. No. 16/047,044, Notice of Allowance dated Oct. 31, 2019, 9 pages.
U.S. Appl. No. 16/047,044, Ex Parte Quayle Action dated Sep. 13, 2019, 8 pages.
U.S. Appl. No. 16/047,044, Response to Ex Parte Quayle Action dated Sep. 20, 2019, 6 pages.
U.S. Appl. No. 16/047,043, Notice of Allowance dated Sep. 11, 2019, 12 pages.

* cited by examiner

ASYMMETRIC GATE CUT ISOLATION FOR SRAM

This application is related to U.S. application Ser. No. 16/047,043, filed Jul. 27, 2018, entitled WORK FUNCTION METAL PATTERNING FOR N-P SPACES BETWEEN ACTIVE NANOSTRUCTURES, currently pending; and U.S. application Ser. No. 16/047,044, filed Jul. 27, 2018, entitled WORK FUNCTION METAL PATTERNING FOR N-P SPACES BETWEEN ACTIVE NANOSTRUCTURES USING UNITARY ISOLATION PILLAR, currently pending.

BACKGROUND

Technical Field

The present disclosure relates to integrated circuits, and more particularly to creating an asymmetric gate cut isolation for a static random-access memory (SRAM).

Related Art

Field-effect transistors (FET) include doped source/drain regions that are formed in a semiconductor and separated by a channel region. A gate insulation layer is positioned about the channel region and a conductive gate electrode is positioned over or about the gate insulation layer. The gate insulation layer and the gate electrode together may be referred to as the gate stack for the device. By applying an appropriate voltage to the gate electrode, the channel region becomes conductive and current is allowed to flow from the source region to the drain region.

To improve the operating speed of the FETs, and to increase the density of FETs on an integrated circuit (IC), designs have gradually become smaller in size. Reductions to the size and the channel length in FETs can improve the switching speed of the FETs. A number of challenges arise as feature sizes of FETs and ICs get smaller. For example, significant downsizing of traditional FETs may produce electrostatic issues and mobility degradation. Scaled-down FETs may have shorter gate lengths that make it more difficult to control the channel. New device architectures such as "gate-all-around" active nanostructures allow further scaling of ICs, in part, because the gate is structured to wrap around the channel, creating more surface area and better control. This structure can provide better control with lower leakage current, faster operations, and lower output resistance. Active nanostructures used to form the channel can include a semiconductor nanowire, i.e., a vertically or horizontally oriented thin wire, or a plurality of stacked nanosheets, i.e., a plurality of vertically spaced semiconductor sheets.

In very small transistors such as nanostructure FETs, metal gates are used to provide high performance. The threshold voltage of a FET is the minimum voltage required to create the conducting path between the source and drain. Metal gates include a gate metal with a work function metal (WFM) and a layer having a high dielectric constant (high-k) in a combination known as high-k metal gate (HKMG). The work function metal is typically located between the high-k layer and the metal gate, and is used to tune the threshold voltage of the transistor. The work function is the minimum energy (usually measured in electron volts) needed to remove an electron from a solid to a point immediately outside the solid surface (or energy needed to move an electron from the Fermi energy level into vacuum), i.e., the final electron position is far from the surface on the atomic scale but still close to the solid on the macroscopic scale. Different transistors may require different threshold voltages, and therefore different work function metals. For example, a PFET (a FET with a channel that contains holes) may require a different work function metal than an NFET (a FET with a channel that contains electrons).

Some integrated circuits, known as bimetallic integrated circuits, include both NFETs and PFETs. In some cases, an integrated circuit design may include a PFET directly adjacent to an NFET. In such situations, methods referred to as self-aligned gate edge (SAGE) processes are used to allow scaling of the adjacent active nano structures. Current SAGE processes create symmetrically spaced gate cut isolations to electrically isolate gates of adjacent FETs in a space between active nanostructures of adjacent FETs, e.g., in what is referred to as an N-to-P space between active nanostructures of an adjacent NFET and PFET. An SRAM requires a gate extension cross-couple contact that electrically shorts a gate to an adjacent source/drain. Use of self-aligned, symmetrically spaced gate cut isolations with the cross-couple contact increases the SRAM cell area requirements, making formation tolerances extremely small for current lithographic techniques. In addition, current SAGE processes restrict additional N-to-P scaling.

SUMMARY

A first aspect of the disclosure provides a method, comprising: in a static random access memory (SRAM) region of the substrate: forming a first active nanostructure on a substrate and a second active nanostructure on the substrate, the first and the second active nanostructures being adjacent to each other and separated by a first space; forming a sacrificial liner over at least a side of the first active nanostructure facing the first space, the sacrificial liner causing a first distance between a remaining portion of the first space and the first active nanostructure to be greater than a second distance between the remaining portion of the first space and the second active nanostructure; forming a gate cut isolation in the remaining portion of the first space between the first and second active nanostructures, the gate cut isolation being closer to the second active nanostructure than the first active nanostructure; and forming a first gate over the first active nanostructure and a second gate over the second active nanostructure, the first gate separated from the second gate by the gate cut isolation, wherein forming the first and second gates includes removing the sacrificial liner.

A second aspect includes an integrated circuit (IC), comprising: a static random access memory (SRAM) including: a first n-type field effect transistor (NFET) having a first active nanostructure on a substrate, and a first gate surrounding the first active nanostructure; a first p-type field effect transistor (PFET) having a second active nanostructure on the substrate adjacent to the first active nanostructure of the first NFET, and a second gate surrounding the second active nanostructure; and a first gate cut isolation separating the first gate from the second gate, the first gate cut isolation being closer to the second active nanostructure of the first PFET than the first active nanostructure of the first NFET.

A third aspect includes an static random access memory (SRAM), comprising: an n-type field effect transistor (NFET) having a first active nanostructure on a substrate, and a first gate surrounding the first active nanostructure; a p-type field effect transistor (PFET) having a second active nanostructure on the substrate adjacent to the first active nanostructure of the NFET, and a second gate surrounding the second active nanostructure; and a gate cut isolation separating the first gate from the second gate, the gate cut isolation being closer to the second active nanostructure of the PFET than the first active nanostructure of the NFET.

BRIEF DESCRIPTION OF THE DRAWINGS

The embodiments of this disclosure will be described in detail, with reference to the following figures, wherein like designations denote like elements, and wherein.

Figure 1:
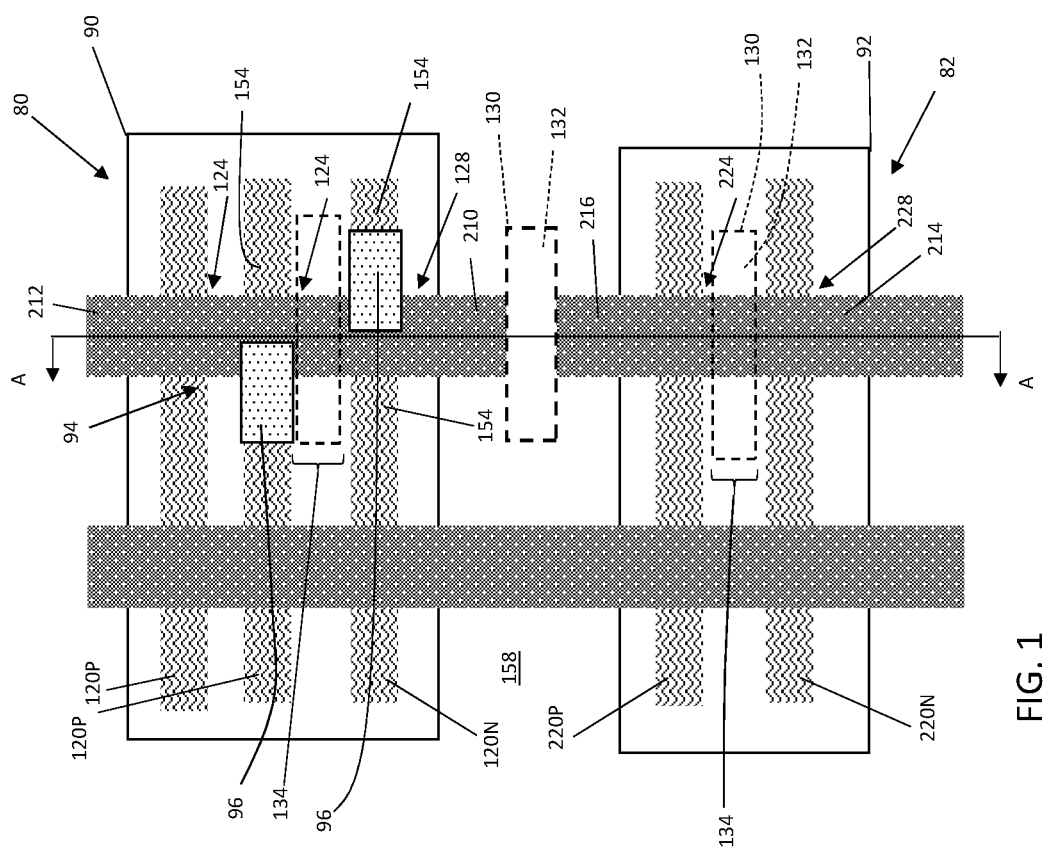
FIG. 1 shows a plan view of an IC layout according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the present disclosure provide methods of forming a gate cut isolation for an SRAM that is asymmetric. The method includes forming a first and second active nanostructures adjacent to each other and separated by a space; and forming a sacrificial liner over at least a side of the first active nanostructure facing the space, causing a first distance between a remaining portion of the space and the first active nanostructure to be greater than a second distance between the remaining portion of the space and the second active nanostructure. Various embodiments form the sacrificial liner by removing a protective layer from over at least a side of a first active nanostructure, and forming the sacrificial liner on at least a side thereof, reducing the size of the first space. A gate cut isolation is formed in the remaining portion of the space such that it is closer to the second active nanostructure than the first active nanostructure. The sacrificial liner is removed, and gates formed over the active nanostructures with the gates separated from each other by the gate cut isolation. An SRAM including the gate cut isolation and an IC structure including the SRAM are also included.

It will be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Referring to the drawings, a method according to embodiments of the disclosure will be described. FIG. 1 shows a plan view of an integrated circuit (IC) layout 80 according to embodiments of the disclosure. FIG. 1 shows IC layout 80 with an integrated circuit (IC) 82 completed, but FIG. 1 will also be referenced for purposes of description of the steps of the method according to embodiments of the disclosure. As shown in FIG. 1, IC layout 80 includes a plurality of p-type active nanostructures 120P, 220P for p-type field effect transistors (PFETs) 124, 224, i.e., where gates 212, 216 extend over active nanostructures 120P, 220P, respectively. IC layout 80 also includes a plurality of n-type active nanostructures 120N, 220N for n-type field effect transistors (NFETs) 128, 228, i.e., where gates 210, 214 extend over active nanostructures 120N, 220N, respectively. (Active nanostructures may be collectively referred to herein with just references 120, 220). IC layout 80 has a first gate region 90 (one shown, in center) in which gates of adjacent NFETs 128 and PFETs 124 are electrically isolated. First gate region 90 may be used, for example, in a static random access memory (SRAM) region (hereinafter referred to as 'SRAM region 90'). IC layout 80 also may have a second gate region 92 in which gates of adjacent NFETs 228 and PFETs 224 may or may not be electrically connected or shared. Second gate region 92 may be used, for example, as a logic region (hereinafter referred to as 'logic region 92').

For purposes of description, FIG. 1 also shows gate cut landing areas 130 for intended gate cut isolations 132 (not actually built, shown in phantom) between adjacent P and N type active nanostructures 120P, 220P and 120N, 220N. Gate cut landing area 130 would conventionally be defined between respective adjacent PFETs 124, 224 and NFETs 128, 228 in an N-P spacing 134 therebetween. (Other gate cut isolations (not shown) may isolate adjacent NFETs and adjacent PFETs). As understood by one skilled in the art, a conventional gate cut isolation is typically formed after forming a dummy gate (not shown, where gates 210, 212, 214, 216 exist). For example, a gate cut isolation may be formed by creating an opening in the dummy gate between active nanostructures to a substrate therebelow and filling the opening with an insulator that remains in place after dummy gate removal. Alternatively, a gate cut isolation can be formed in a dummy gate opening (after dummy gate removal), followed by forming the metal gate about the gate cut isolation. As shown in FIG. 1, an SRAM 94 including NFET 128 and PFET 124 may also include a cross-couple contact 96. Contact 96 makes use of a symmetric, centered gate cut isolation 132 (shown in phantom) challenging because the contact, the gate cut isolation and the gate conductor tolerances are too small, e.g., perhaps 7 nanometers, for current lithographic techniques.

Figure 2:
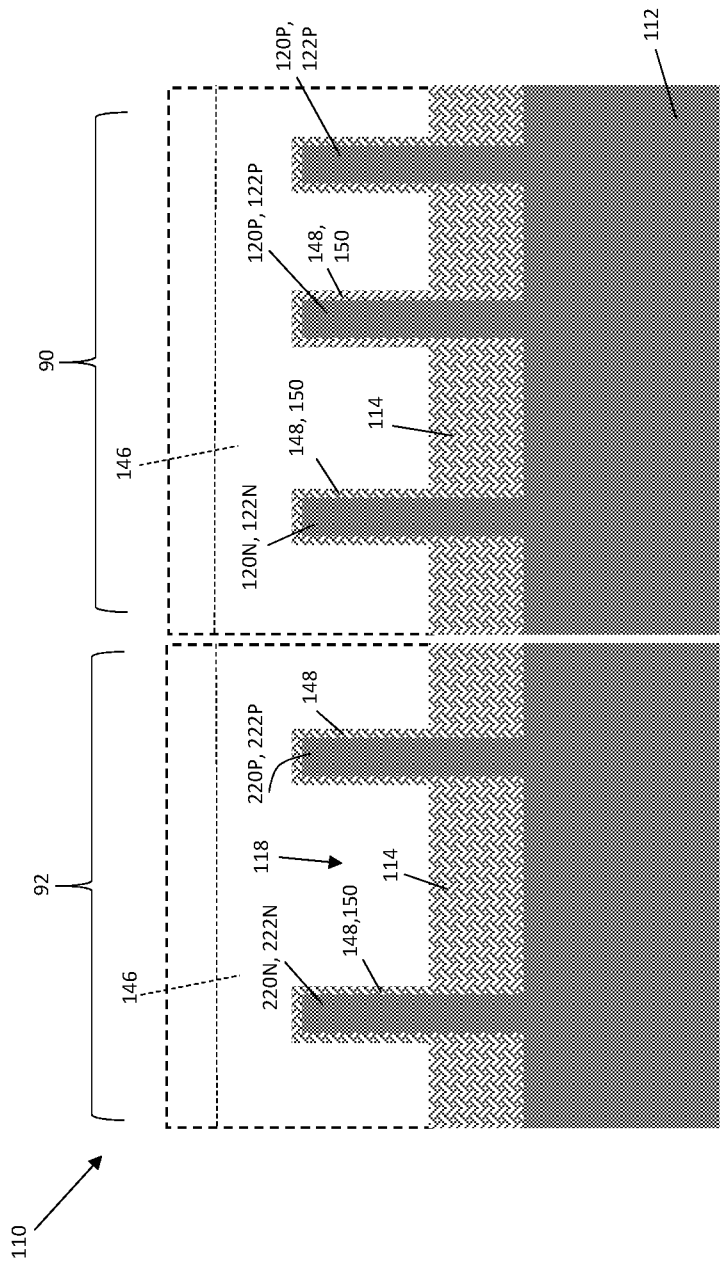
FIG. 2 shows a cross-sectional view of active nanostructure formation in the form of semiconductor fins, according to embodiments of the disclosure.

FIG. 2 shows a cross-sectional view of a precursor structure 110 along line A-A in FIG. 1 of IC layout 80. SRAM region 90 is to the right of logic region 92 in the cross-sectional view. Precursor structure 110 may include a substrate 112 which may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. Substrate 112 may also take the form of a semiconductor-on-insulator (SOI) substrate, including an SOI layer over a buried insulator layer (not shown) over a bulk semiconductor layer. The buried insulator layer may include, for example, silicon oxide, and the semiconductor layers may include any semiconductor material listed herein.

FIG. 2 also shows a plurality of shallow trench isolations (STIs) 114 separating active nanostructures 120N, 220N, 120P, 220P. Each STI 114 may include a trench etched into substrate 112 filled with an insulator, or an insulator deposited on top of substrate 112. STIs 114 isolate one region of the substrate from an adjacent region of the substrate. As understood, one or more transistors of a given polarity may be disposed within an area isolated by STI 114. Each STI 114 may be formed of any currently-known or later developed substance for providing electrical insulation, and as examples may include: silicon oxide ($SiO_2$), fluorinated $SiO_2$ (FSG), silicon nitride ($Si_3N_4$), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

FIG. 2 shows, in SRAM region 90, forming a first active nanostructure 120P on substrate 112 and a second active nanostructure 120N on substrate 112 separated by a first space 116. FIG. 2 also shows, in logic region 92, forming a third active nanostructure 220P on substrate 112 and a fourth active nanostructure 220N on substrate 112 separated by a second space 118. This step may occur before or after STI 114 formation. Active nanostructures 120 may be formed using any now known or later developed lithography process. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by being exposed to radiation, where the radiation (selectively) passes through an intervening mask or template containing the pattern. As a result, the exposed or unexposed areas of the resist coating become more or less soluble, depending on the type of photoresist used. A photoresist developer is then used to remove the more soluble areas of the resist leaving a patterned resist. The patterned resist can then serve as a mask for the underlying layers which can then be selectively treated, such as to receive dopants and/or to undergo etching, for example. Here, the nanostructures are etched to form their final shape. "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

After formation, first and second active nanostructures 120P, 120N are adjacent to each other on substrate 112 and separated by first space 116. First space 116 may be less than 40 nanometers (nm). As used herein, "active nanostructure" may include any form of vertically oriented semiconductor structure for providing a channel of a transistor device, e.g., one capable of a gate all around arrangement. Active nanostructures 120 can include but are not limited to: a plurality of semiconductor nanowires, i.e., a vertically or horizontally oriented thin wire; a plurality of semiconductor fins (shown in FIGS. 2-8); or a plurality of stacked nanosheets (shown in FIGS. 9-15), i.e., a plurality of vertically spaced semiconductor sheets. In the embodiment shown in FIG. 2, active nanostructures 120 are semiconductor fins 122, and active nanostructures 220 are semiconductor fins 222. Here, forming active nanostructures 120 may include, for example, epitaxially growing the fins from substrate 112, or patterning and etching them from substrate 112. Embodiments of the disclosure may be applied to active nanostructures 120, 220 as semiconductor fins, but also any variety of alternative forms of active nanostructures including but not limited to: semiconductor nanosheets, semiconductor nanowires, etc. That is, the teachings of the disclosure are applicable to any variety of nanostructure.

Continuing with FIG. 2, it is noted that first space 116 between active nanostructures may have a different width between pairs of adjacent NFETs and PFETs (N-P spacing), adjacent NFETs and/or adjacent PFETs. For example, N-P spacing 134 may be smaller than spacing at other locations such that only one gate cut isolation is formed in an N-P space, but two may be formed in N-N or P-P space. Active nanostructures 120N, 120P may be etched to their shapes shown using any appropriate etching process. Once active nanostructures 120N, 120P are shaped, a mask (not shown) used may be removed, e.g., using any appropriate ashing process to remove the mask.

As will be described relative to various embodiments of active nanostructures, in desired region(s) of IC layout 80 (FIG. 1), methods may remove a protective layer from over at least a side of selected active nanostructure, e.g., 120N, and form a sacrificial liner on at least a side of the nanostructure, reducing the size of first space 116. A gate cut isolation formed in a remaining portion of first space 116 is shifted toward the adjacent active nanostructure, e.g., 120P, making it asymmetrical relative to the active nanostructures 120N, 120P. Hence, the location of the protective layer on an active nanostructure dictates toward which direction (and active nanostructure) the gate cut isolation will be shifted. The extent and form of the removal of the protective layer can take a variety of forms depending on, for example, the type of active nanostructure. As will be described, the FIGS. 2-8 and 10 embodiments use a mask that protects an entirety of the active nanostructure toward which the gate cut isolation will be shifted. Here, a mask exposes an entirety of the active nanostructure to which the sacrificial liner is applied, allowing removal of the protective layer from and formation of the sacrificial liner over an entirety of the active nanostructure. The protective layer remains over all other active nanostructures. These embodiments are advantageous for active nanostructures that may be too narrow to precisely land a mask edge on, e.g., semiconductor fins having a width less than 10 nanometers (nm), or where mask edge landing precision is not necessary. In contrast, the FIGS. 9 and 11-15 embodiments leave the protective layer over mainly just a side of the active nanostructure toward which the gate cut isolation will be shifted. These embodiments may be applied to active nanostructures that are wide enough to have a mask edge land thereon, e.g., semiconductor nanosheet stacks having a width greater than 10 nm, allowing the mask to protect a small portion of the protective layer. In this latter case, the protective layer is removed from all other active nanostructures except for the side of the selected active nanostructure toward which the gate cut isolation will be shifted.

FIG. 2 also shows a cross-sectional view of first and second active nanostructures 120N, 120P with first space 116 therebetween after removal of dummy gate(s) 146 (shown in phantom) as part of a replacement metal gate (RMG) process. Typically, dummy gates 146 include a sacrificial material such as amorphous silicon or polysilicon (not shown), and a dummy gate oxide layer 148 over active nanostructures 120. At this stage, source/drain regions 154 (FIG. 1) would be formed in active nanostructures 120N, 120P on opposing sides of where dummy gate 146 (where gates 210, 212, 214, 216 are shown in FIG. 1) was provided, e.g., via ion implantation of dopants. In accordance with embodiments of the disclosure, dummy gate oxide layer 148 remains as a protective layer 150. That is, protective layer 150 may be a dummy gate oxide layer 148 formed as part of an RMG process prior to forming sacrificial liner 170. It is understood that FIG. 2 shows a cross-section in a gate cavity opening (after dummy gate 146 removal) for gate regions 90, 92 (FIG. 1). It is understood that active nanostructures 120, 220 will generally be surrounded by an interlayer dielectric (ILD) 158 (FIG. 1). ILD 158 may include but is not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

FIGS. 3-6 show cross-sectional views of a process of forming a gate cut isolation 160 (FIG. 6) between first and second active nanostructures 120N, 120P, and a gate cut isolation 260 (FIG. 6) between third and fourth active nanostructures 220N, 220P. Gate cut isolations 160, 260 may be formed using any now known or later developed gate cut isolation formation process. As will be described in greater detail herein, gate cut isolations 160, 260 may have a lower portion 162, 262 in a remaining portion 180 (FIG. 6) of first space 116 and an upper, wider portion 164, 264. Upper portion 164, 264 and lower portion 162, 262 are unitary, i.e., there is no seam between the portions and they are formed as one, integral structure. Relative to SRAM region 90, the teachings of the disclosure will be described relative to isolation pillar 160 between first and second active nanostructures 120N, 120P for an NFET 128 and PFET 124, i.e., for N-P space 134 (FIG. 1). Relative to logic region 92, the teachings of the disclosure will be described relative to isolation pillar 260 (FIG. 6) between third and fourth active nanostructures 220N, 220P for an NFET 228 and PFET 224, i.e., for another N-P space 134 (FIG. 1). It is understood that gate cut isolation 160 and gate cut isolation 260 formation may occur simultaneously. It is also noted that, while not shown, one or more gate cut isolations may be formed in spaces between the same types of FETs. That is, gate cut isolation(s) may be formed between all adjacent active nanostructures on the substrate, e.g., in N-N spaces and P-P spaces.

Figure 3:
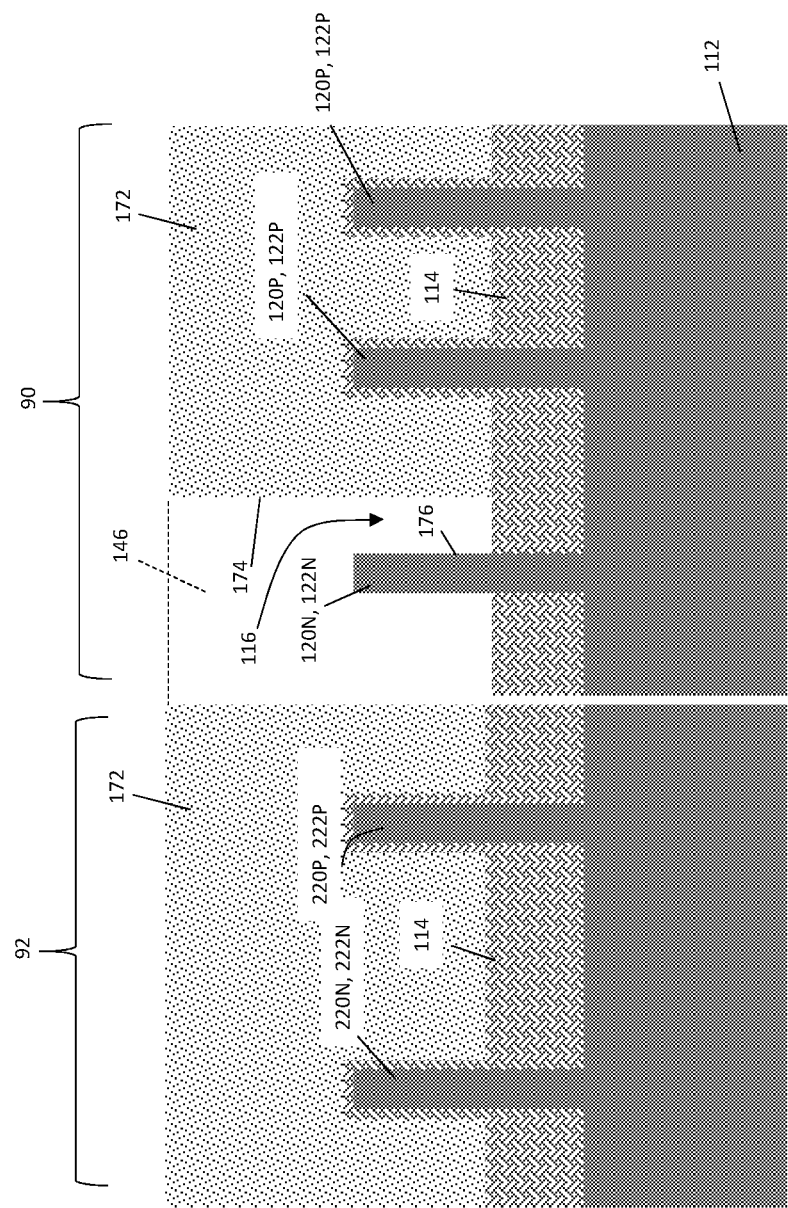
FIG. 3 shows a cross-sectional view of removing a protective layer from a first active nanostructure, according to embodiments of the disclosure.
Figure 4:
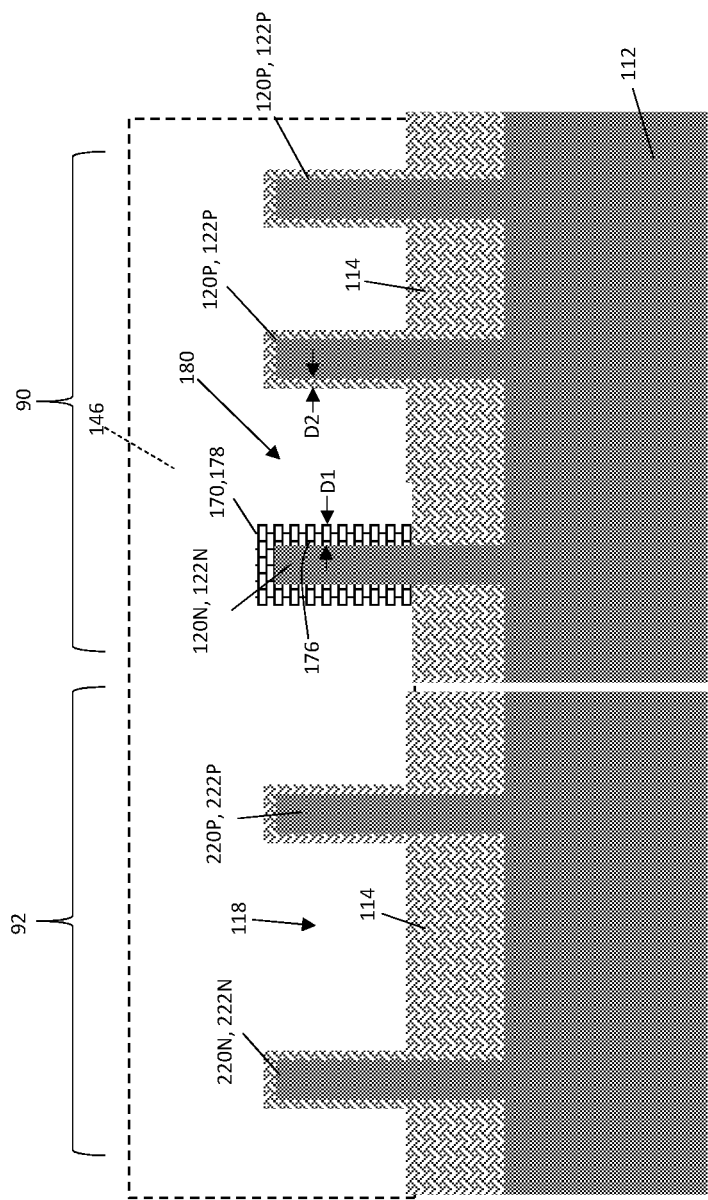
FIG. 4 shows a cross-sectional view of forming of a sacrificial liner over the first active nanostructure, according to embodiments of the disclosure.

As shown in the cross-sectional view of FIGS. 3-4, embodiments of the disclosure may include forming a sacrificial liner 170 (FIG. 4) over at least a side of first active nanostructure 120N facing space 116. In the FIGS. 3-4 embodiments, forming sacrificial liner 170 may include forming protective layer 150 over first and second semiconductor fins 122N, 122P, i.e., active nanostructures 120N, 120P. As noted previously, protective layer 150 may be dummy gate oxide 148 remaining after dummy gate removal (FIG. 2). However, protective layer 150 may be deposited after dummy gate removal, if desired. FIG. 3 shows forming a mask 172 exposing first semiconductor fin 122N. Mask 172 may include any now known or later developed photoresist mask. As illustrated, an edge 174 of mask 172 can land in first space 116 between semiconductor fins 122N, 122P. Mask 172 covers logic region 92 and other active nanostructures, e.g., second semiconductor fin(s) 122P in SRAM region 90.

FIG. 3 also shows removing protective layer 150 from first semiconductor fin 122N entirely, leaving protective layer 150 over second semiconductor fin 122P, among other structures. Protective layer 150 may be removed using any appropriate etching process for the material of protective layer, which in the example provided is an oxide. For example, the etching may include a RIE. Mask 172 may be removed using any appropriate process, e.g., an ashing process.

FIG. 4 shows forming a sacrificial liner 170 over at least a side 176 of first active nanostructure 120N, i.e., semiconductor fin 122N, facing space 116. Sacrificial liner 170 may be formed by epitaxially growing a sacrificial material 178 over at least side 176 of first semiconductor fin 122N. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Sacrificial liner 170 may include, for example, silicon germanium, but could include other selectively grown material over active nanostructures, e.g., metal, dielectric, etc. In the example shown, sacrificial material 178 is epitaxially grown over all of first semiconductor fin 122N, and may include the same material as the semiconductor fins. As shown in FIG. 4, sacrificial liner 170 causes a first distance D1 between a remaining portion 180 of space 116 (FIG. 3) and first semiconductor fin 122N, i.e., first active nanostructure 120N, to be greater than a second distance D2 between remaining portion 180 of space 116 (FIG. 3) and second semiconductor fin 122P, i.e., a thickness of dummy gate oxide layer 148 over second active nanostructure 120P. In this manner, the space between active nanostructures 120N, 120P has been shifted away from n-type active nanostructure 120N towards p-type active nanostructure 120P for SRAM region 90. That is, space 116 is no longer symmetrically arranged with active nanostructures 120N, 120P; it is asymmetric.

Figure 5:
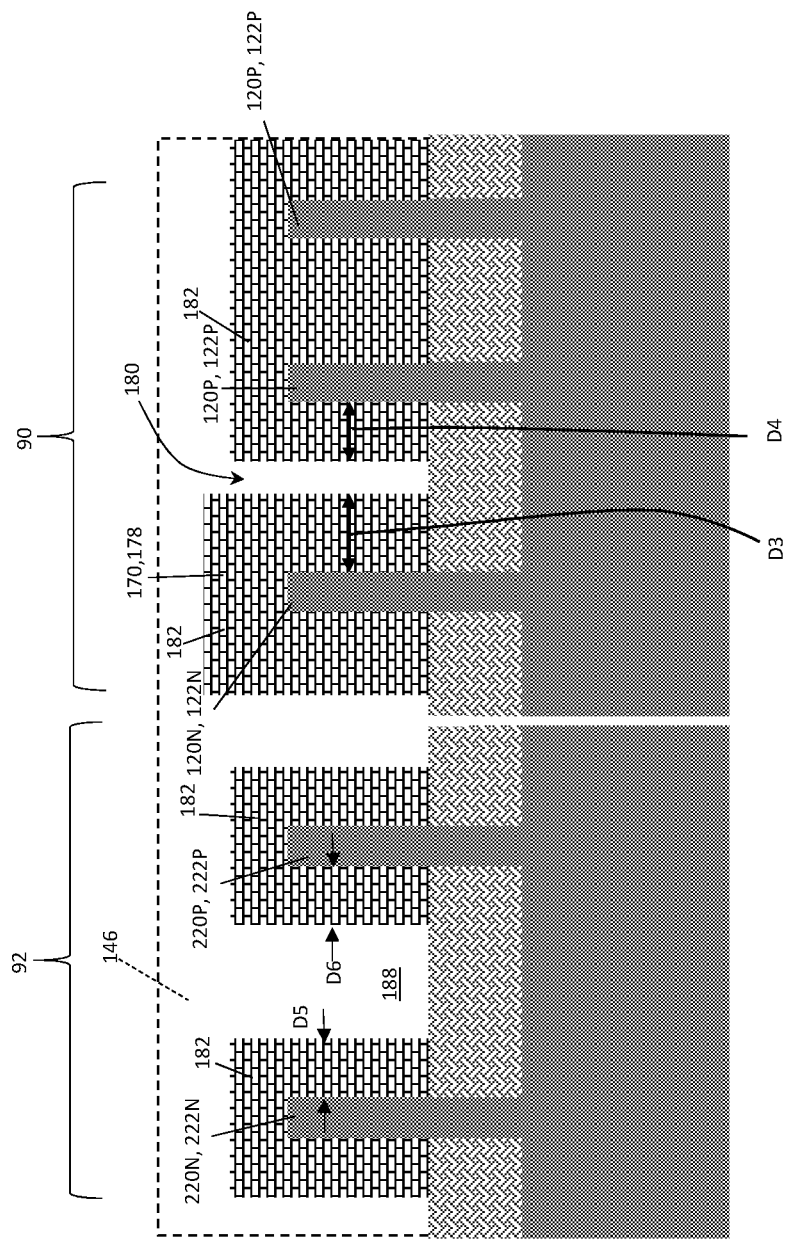
FIG. 5 shows a cross-sectional view of forming additional sacrificial material over the active nanostructures, according to embodiments of the disclosure.

FIG. 5 shows the structure after a number of additional steps. First, FIG. 5 shows removing protective layer 150 from over second semiconductor fin 122P. More particularly, a selective etch is performed to remove protective layer 150 from second semiconductor fin 122P. Protective layer 150 may be removed, e.g., by an oxide RIE. As illustrated, protective layer 150 is also removed from over active nanostructures 220P, 220N in logic region 92. FIG. 5 also shows epitaxially growing additional sacrificial material 182 over sacrificial liner 170 and second semiconductor fin 122P. Sacrificial material 182 also forms, e.g., epitaxially grows, on third and fourth active nanostructures 220N, 220P in logic region 92. As shown in FIG. 5, sacrificial material 182 causes a distance D3 between remaining portion 180 of space 116 (FIG. 3) and first semiconductor fin 122N, i.e., first active nanostructure 120N, to be further increased in size. Distance D3 remains greater than distance D4 between remaining portion 180 of space 116 (FIG. 3) and second semiconductor fin 122P, i.e., second active nanostructure 120P. In this manner, the space has been reduced in size but remains shifted from n-type active nanostructure 120N towards p-type active nanostructure 120P for SRAM region 90. Remaining portion 180 remains asymmetrically arranged between active nanostructures 120N, 120P. In contrast, in logic region 92, a distance D5 between a remaining portion 188 of second space 118 (FIG. 4) and third active nanostructure 220N is substantially equal to a distance D6 between remaining portion 188 of second space 118 (FIG. 4) and fourth active nanostructure 220P. That is, remaining portion 188 of second space 118 (FIG. 4) between third and fourth active nanostructures 220N, 220P remains symmetrically arranged. Sacrificial liner 170 may be applied in any region of the IC layout in which the asymmetrical arrangement for a gate cut isolation is desired.

Figure 6:
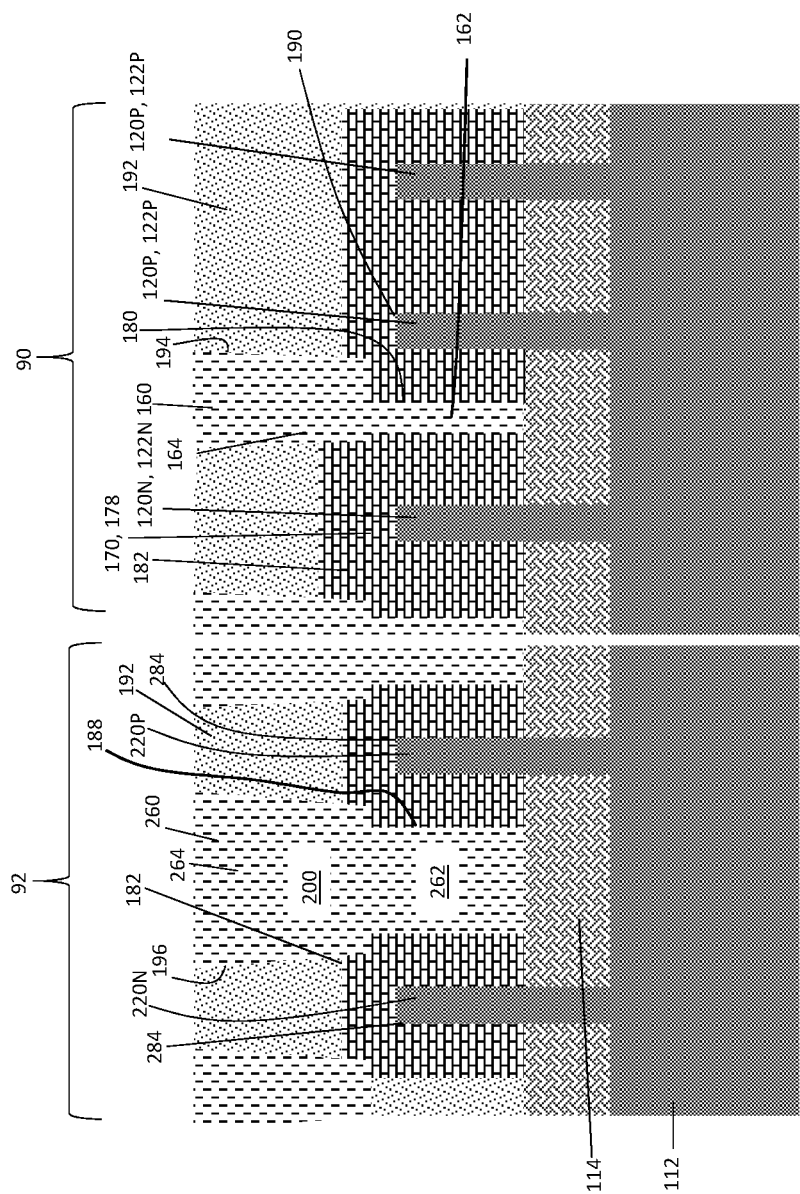
FIG. 6 shows a cross-sectional view of forming gate cut isolations including an asymmetric gate cut isolation in an SRAM region of the IC, according to embodiments of the disclosure.

FIG. 6 shows a cross-sectional view of one embodiment of forming a gate cut isolation 160 in remaining portion 180 of space 116 (FIG. 2) between first and second active nanostructures 120N, 120P. FIG. 6 also shows forming another gate cut isolation 260 in remaining portion 188 of second space 118 (FIG. 4) between third and fourth active nanostructures 220N, 220P. In this embodiment, a dielectric 192 may be deposited, e.g., an oxide, and then patterned and etched to create opening 194 (in SRAM region 90) therein. The etching may have a duration to remove dielectric 192 from remaining portion 180, resulting in opening 194 communicating with remaining portion 180 of first space 116 (FIG. 2). Similarly, dielectric 192 may be patterned and etched to create opening 196 (in logic region 92). As noted, the etching may have a duration to remove dielectric 192 from remaining portion 188, resulting in opening 196 communicating with remaining portion 188 of second space 118 (FIG. 4). As observed in FIG. 13, openings 194 and 196 are wider than remaining portions 180, 188, respectively. Openings 194, 196 and remaining portions 180 and 188 can be filled with a dielectric 200 to create gate cut isolations 160, 260. This process may include depositing dielectric 200, e.g., using CVD. Dielectric 200 may include but is not limited to: silicon oxycarbide (SiOC), silicon oxide, silicon oxy-carbide nitride (SiOCN), silicon nitride (SiN) or silicon boron carbon nitride (SiBCN). Dielectric 200 fills each opening 194, 196, 180, 188, creating gate cut isolations 160, 260. Any necessary planarization may be carried out after dielectric 200 deposition.

As noted, gate cut isolation 160 is closer to second active nanostructure 120P than first active nanostructure 120N, i.e., in SRAM region 90. Gate cut isolation 160 has a lower portion 162 in remaining portion 180 of first space 116 (FIG. 4) and an upper portion 164 extending above an upper surface 190 of second active nanostructure 120P. Upper portion 164 and lower portion 162 are unitary and upper portion 164 is wider than lower portion 162. Upper portion 164 may extend slightly toward first active nanostructure 120N from lower portion 162, but this is not necessary. In contrast, gate cut isolation 260 is equidistant from third active nanostructure 220N and fourth active nanostructure 220P, i.e., semiconductor fins 222N, 222P. Gate cut isolation 260 has a lower portion 262 in remaining portion 188 of first space 118 (FIG. 4) and an upper portion 264 extending above (above and towards) an upper surface 284 of third and fourth active nanostructures 220N, 220P. Upper portion 264 and lower portion 262 are unitary, and upper portion 264 is wider than lower portion 262. As illustrated, gate cut isolation 260 in logic region 92 may have a T-shape cross-section. Each gate cut isolation 160, 260 may have a height thereof reduced, as desired.

Figure 7:
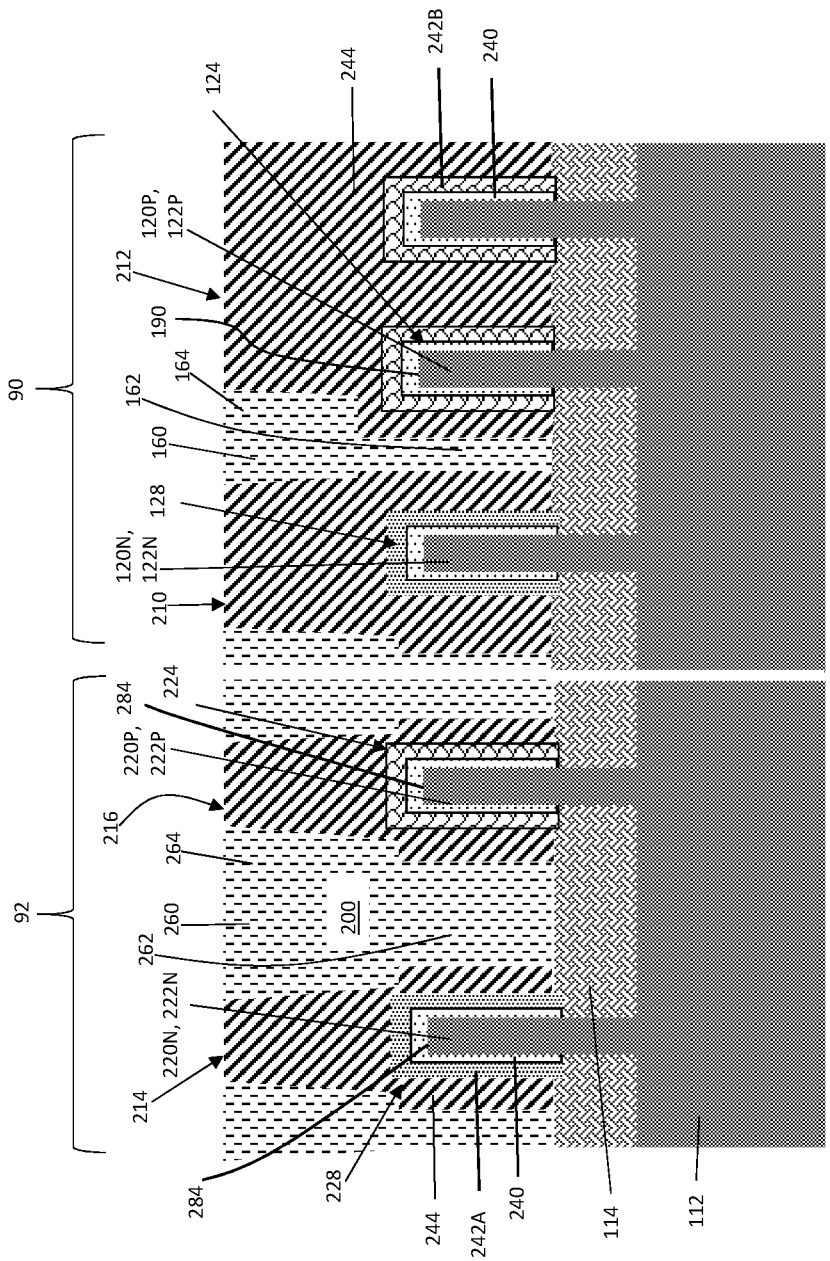
FIG. 7 shows a cross-sectional view of forming gates, according to embodiments of the disclosure.
Figure 8:
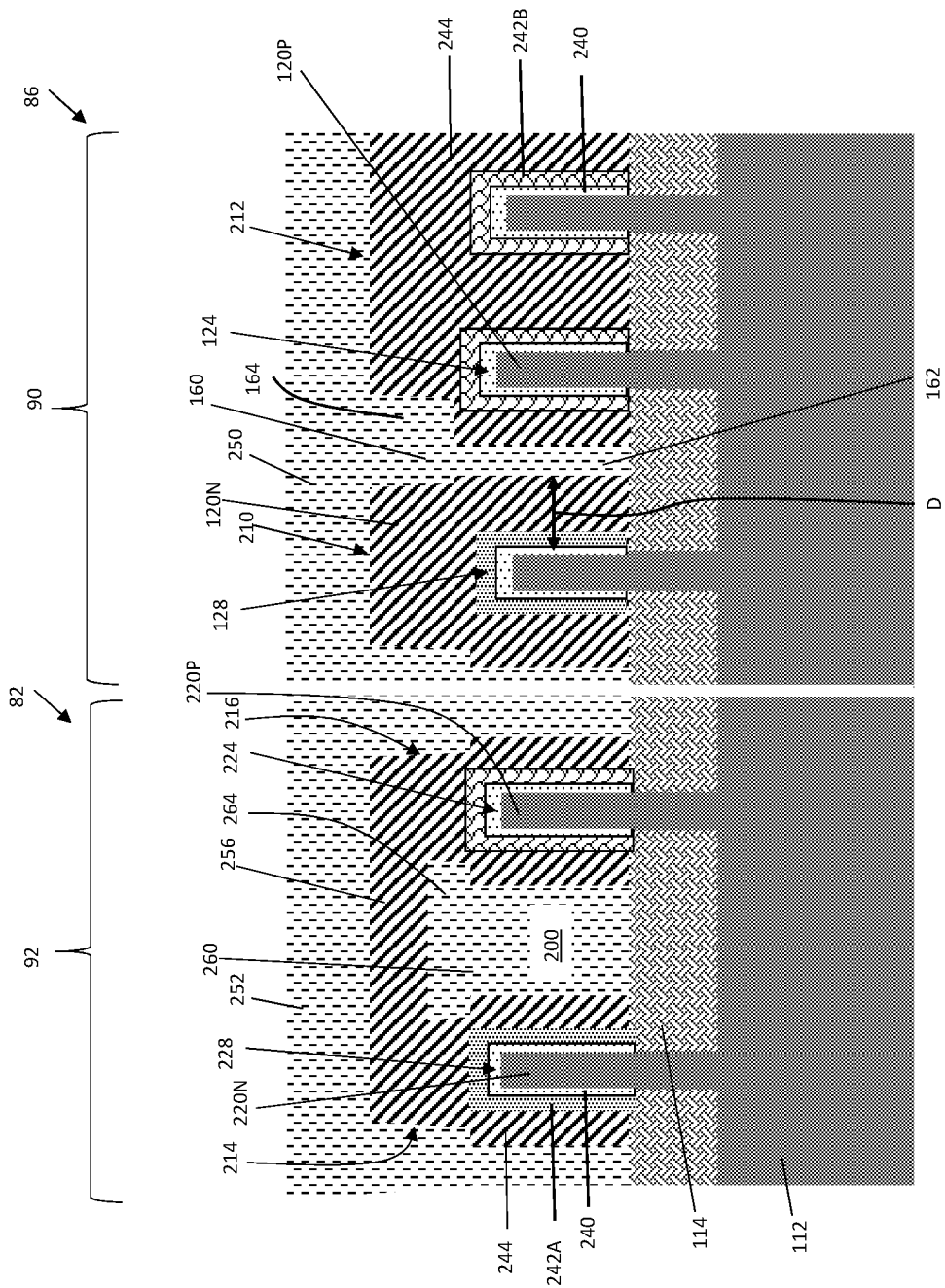
FIG. 8 shows a cross-sectional view of forming a conductive strap in a logic region of the IC, according to embodiments of the disclosure.

FIGS. 7-8 show cross-sectional views of a number of additional steps. FIG. 7 shows forming a first gate 210 over first active nanostructure 120N and a second gate 212 over second active nanostructure 120P. This process may include removing sacrificial liner 170 (FIG. 6) and additional sacrificial material 180 (FIG. 6). As illustrated, first gate 212 is separated from second gate 212 by gate cut isolation 160. As understood, gates 210, 212 form FETs 124, 128 (FIG. 1 also) with active nanostructures 120N, 120P, respectively, i.e., with semiconductor fins 122N, 122P. FIGS. 7 and 8 also show forming a third gate 214 over third active nanostructure 220N and a fourth gate 216 over fourth active nanostructure 220P. Third and fourth gates 214, 216 are separated by gate cut isolation 260. As understood, gates 214, 216 form FETs 228, 224 (FIG. 1 also) with active nanostructures 220N, 220P, respectively, i.e., with semiconductor fins 222N, 222P.

Gates 210, 212, 214, 216 may be formed using any now known or later developed method. Gates 210, 212, 214, 216 may include a high dielectric constant (high-K) layer 240, a work function metal layer 242 and a gate conductor 244. High-K layer 240 may include any now known or later developed high-K material typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity).

Work function metal (WFM) layer 242 may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. One type of WFM for one type of FET, e.g., an NFET, may be formed over adjacent gates, and then replaced where over the gate for the other type of FET, e.g., a PFET, with another type of WFM. There are a wide variety of well-known processes for forming the desired WFMs. In one example, gates 210, 212, 214, 216 may be formed as described in related U.S. patent application Ser. No. 16/047,044, filed Jul. 27, 2018, which is hereby incorporated by reference. In this process, after removing sacrificial liner 170 and sacrificial material 180, high-K layer 240 and a first WFM 242A may be formed over first active nanostructure 120N, gate cut isolation 160 and second active nanostructure 120P. First WFM 242A may also be formed over third active nanostructure 220N, gate cut isolation 260 and third active nanostructure 220P. First WFM 242A is a particular WFM for NFETs 124, 224. First WFM 242A may be removed from a part of gate cut isolations 160, 260, creating a discontinuity in the first WFM separating the first WFM over first active nanostructure 120N from the first WFM over second active nanostructure 120P (and similarly separating first WFM 242A over third nanostructures 220N from fourth nanostructures 220P). First WFM 242A may then be etched to remove the first WFM surrounding second active nanostructure 120P (and fourth nanostructure 220P). Gate cut isolation 160, 260 or the discontinuity in first WFM 242A on the part of gate cut isolation 160, 260 prevents the etching from reaching and removing first WFM 242A on first active nanostructure 120N (and third active nanostructure 220N). A second WFM 242B may then be deposited surrounding second active nanostructure 120P (and fourth active nanostructure 220P). Second WFM 242B may be a work function metal for PFETs 128, 228. Gate conductor 244 may then be deposited and planarized, as necessary, to form FETs 124, 128, 224, 228. Gate conductor 244 may include any now known or later developed gate conductor such as copper (Cu).

FIG. 8 shows a cross-sectional view of formation of a conventional gate cap 250 of, for example, a nitride, over gates 210, 212 in SRAM region 90, and a gate cap 252 over gates 214, 216 in logic region 92. FIG. 8 also shows that gates 214, 216 may be optionally electrically coupled by a conductive strap 256 in logic region 92 in a known fashion.

Figure 9:
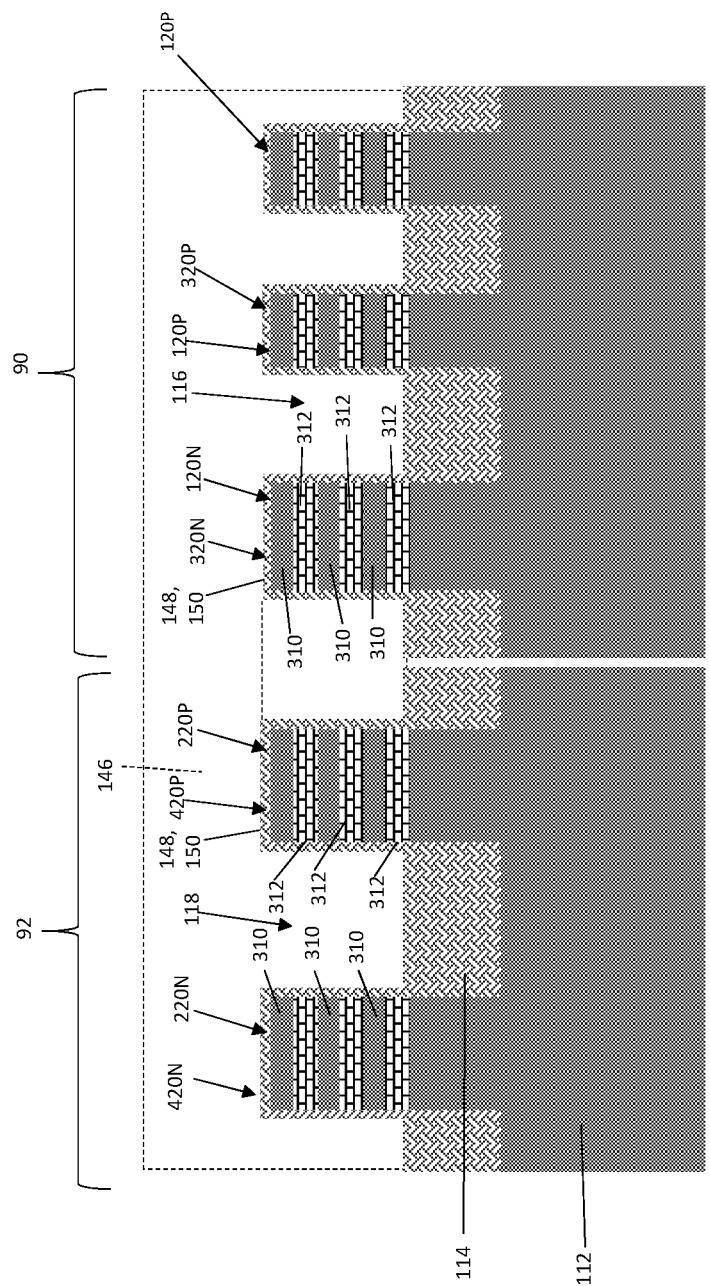
FIG. 9 shows a cross-sectional view of active nanostructure formation in the form of semiconductor nanosheet stacks, according to other embodiments of the disclosure.

Referring to FIGS. 9-15, embodiments of the disclosure may also be applied to active nanostructures in the form of semiconductor nanosheets, i.e., nanosheet stacks. Here, as shown in FIG. 9, forming first and second active nanostructures 120P, 120N may include forming respective first and second nanosheet stacks 320N, 320P, and forming respective third and fourth active nanostructures 220N, 220N include forming respective third and fourth nanosheet stacks 420N, 420P. (Nanosheet stacks may be collectively referred to with references 320, 420). Each nanosheet stack 320, 420 may include nanosheets 310 separated (alternatingly) by sacrificial layers 312. Nanosheets 310 may include a semiconductor, e.g., silicon, and sacrificial layers 312 may include any of a variety of sacrificial materials, such as silicon germanium. Other materials for nanosheets and/or sacrificial layers are possible. The nanosheet stacks may include at least one nanosheet 310. In one embodiment, each nanosheet stack includes three nanosheets 310, as shown in FIG. 9. Nanosheet stacks 320, 420 may be formed by alternating deposition of sacrificial layers 312 and nanosheet 310 layers, followed by photolithographic patterning using a mask (not shown) including a hard mask, e.g., of silicon nitride, and a pad oxide. In contrast to semiconductor fins 122 (FIGS. 2-8), nanosheet stacks 320, 420 are wider. In one non-limiting example, nanosheet stacks 320, 420 may be 25 nanometers wide compared to 5 nanometers for semiconductor fins 122 (FIGS. 2-8). As a result, and in contrast to semiconductor fins 122 (FIGS. 2-8), it is possible to land a mask edge on nanosheet stacks 320, 420. Space 116 between first and second active nanostructures 120N, 120P may be approximately 40 nanometers FIG. 9 also shows a cross-sectional view of first and second active nanostructures 120N, 120P with first space 116 therebetween after removal of dummy gate(s) 146 (shown in phantom). Here, dummy gate oxide layer 148 remains over active nanostructures 120, 220. At this stage, source/drain regions 154 (FIG. 1) would be formed in nanosheets 310 on opposing sides of where dummy gate 146 (where gates 210, 212, 214, 216 are shown in FIG. 1) was provided, e.g., via ion implantation of dopants. As in the previous embodiment, dummy gate oxide layer 148 provides protective layer 150. It is understood that FIG. 9 shows a cross-section in a gate cavity opening for gate regions 90, 92 (FIG. 1). It is understood that active nanostructures 120, 220 will generally be surrounded by ILD 158 (FIG. 1).

Figure 10:
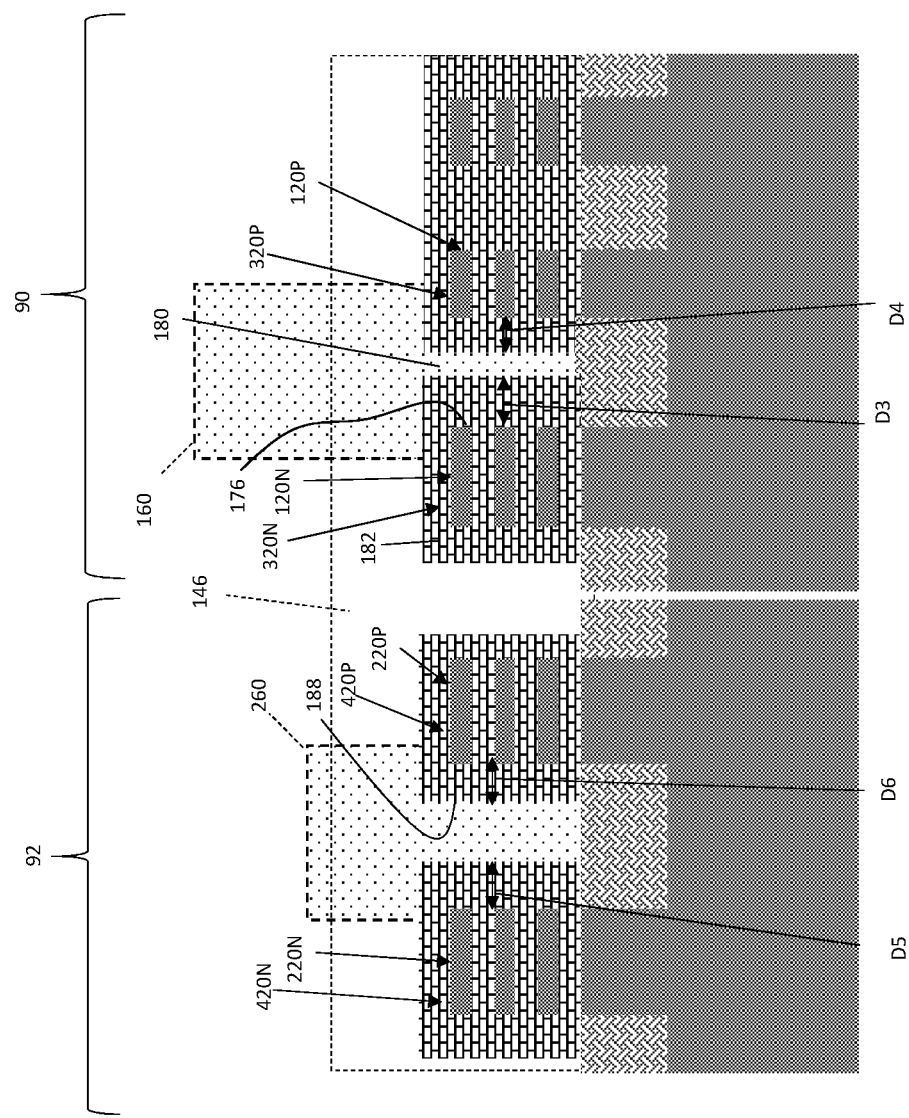
FIG. 10 shows a cross-sectional view of gate cut isolation formation according to FIGS. 2-8 applied to active nanostructures in the form of semiconductor nanosheet stacks as in FIG. 9, according to other embodiments of the disclosure.

FIG. 10 shows an embodiment in which the teachings of FIGS. 2-8 are applied to nanosheet stacks 320, 420 of FIG. 9. This process may include forming protective layer 150 over first and second nanosheet stacks 320N, 320P, as shown in FIG. 2 for semiconductor fins 122. Protective layer 150 may be removed from at least side 176 of first nanosheet stack 320N facing first space 116, as shown in FIG. 3 for semiconductor fins 122. And, similar to FIG. 4, sacrificial liner 170 (shown in phantom in FIG. 10) may be formed over at least side 176 of first nanosheet stack 320N facing first space 116 by epitaxially growing a sacrificial material 178 from semiconductor nanosheets 310 of first nanosheet stack 320N. Protective layer 150 prevent epitaxial growth in areas covered thereby. FIG. 10 shows the structure after a number of additional steps, similar to FIG. 5 as applied to semiconductor fins 122. FIG. 10 shows protective layer 150 removed from over second nanosheet stack 320P. As noted, mask 172 (FIG. 4) is removed, e.g., via an ashing process, and an etch performed to remove protective layer 150 from second nanosheet stack 320P, e.g., by a RIE. The mask and protective layer 150 are also removed from over active nanostructures 220P, 220N in logic region 92, i.e., third and fourth nanosheet stacks 420N, 420P. FIG. 10 also shows epitaxially growing additional sacrificial material 182 over sacrificial liner 170 and second nanosheet stack 320P. Sacrificial material 182 also forms, e.g., epitaxially grows, on active nanostructures 220P, 220N in logic region 92, i.e., third and fourth nanosheet stacks 420N, 420P. As shown in FIG. 10, sacrificial material 182 causes a distance D3 between remaining portion 180 of space 116 (FIG. 9) and first nanosheet stack 320N, i.e., first active nanostructure 120N, to be further increased in size. Distance D3 remains greater than distance D4 between remaining portion 180 of space 116 (FIG. 9) and second nanosheet stack 320P, i.e., second active nanostructure 120P. In this manner, the space has been reduced in size but remains shifted from n-type active nanostructure 120N towards p-type active nanostructure 120P for SRAM region 90. Remaining portion 180 remains asymmetrically arranged between active nanostructures 120N, 120P, i.e., between nanosheet stacks 320N, 320P. In contrast, in logic region 92, a distance D5 between a remaining portion 188 of second space 118 (FIG. 4) and third active nanostructure 220N is substantially equal to a distance D6 between the remaining portion 188 of second space 118 (FIG. 9) and fourth active nanostructure 220P. That is, remaining portion 188 of second space 118 (FIG. 9) between third and fourth active nanostructures 220N, 220P remains symmetrically arranged. Sacrificial liner 170 may be applied in any region of IC layout 80 (FIG. 1) in which the asymmetrical arrangement for a gate cut isolation is desired. Processing would progress from here as described relative to FIGS. 6-8 to create FETs with nanosheets 310.

Figure 11:
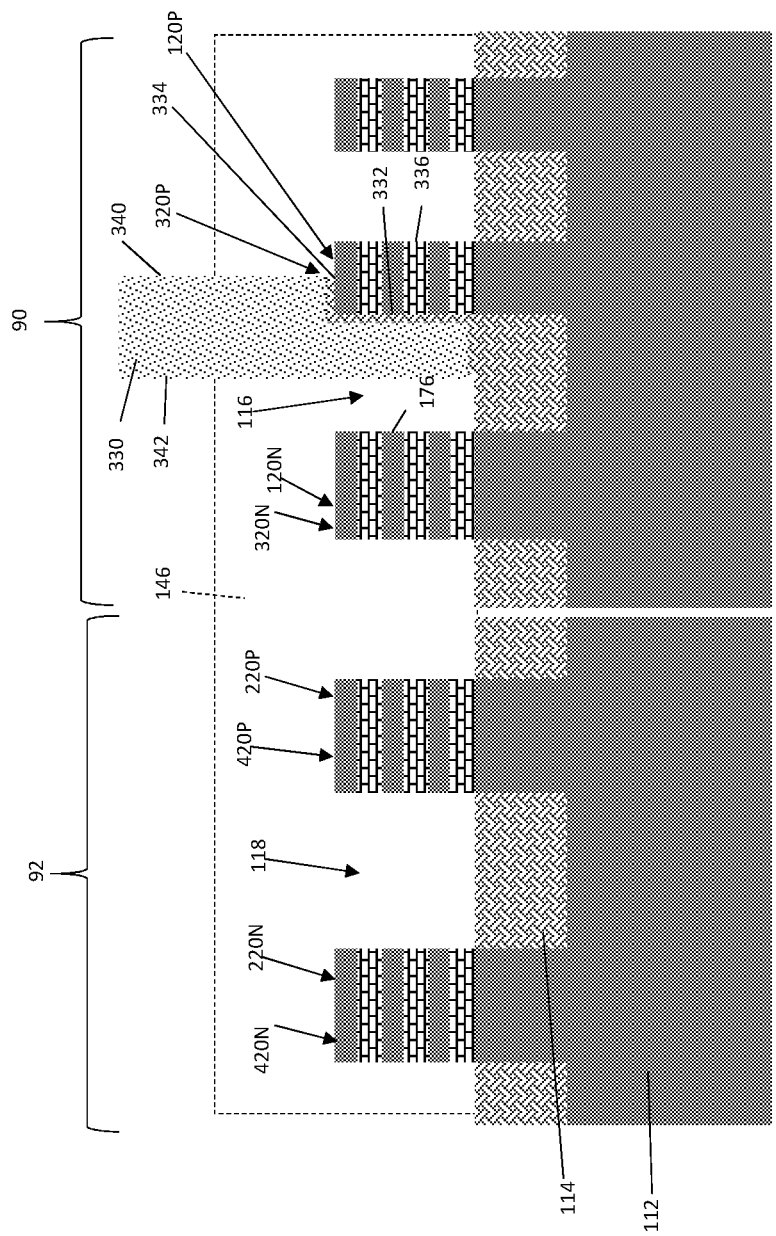
FIG. 11 shows a cross-sectional view of removing a protective layer from a first active nanostructure as in FIG. 9, according to other embodiments of the disclosure.

Returning to FIG. 9 and with further reference to FIGS. 11-15, an embodiment employing a mask 330 landing on second active nanostructure 120P is shown. Mask 330 allows removing of protective layer 150 from at least side 176 of first active nanostructure 120N, but in a more precise manner than the FIGS. 2-8 embodiment. This embodiment can be applied in situations where the active nanostructures are sufficiently wide, e.g., greater than 10 nm, to allow mask 330 edge to land thereon. FIG. 11 shows a cross-sectional view of removing protective layer 150 from at least side 176 of first nanosheet stack 320N facing first space 116. In this embodiment, mask 330 exposes first nanosheet stack 320N, and has a first edge 340 landing on upper surface 334 of second nanosheet stack 320P and covers first side 332 of second nanosheet stack 320P facing first space 116. Mask 330 exposes first nanosheet stack 320N, and may expose second side 336 of second nanosheet stack 320P opposite first space 116. Mask 330 may include any now known or later developed mask material. FIG. 11 shows using mask 330 to remove protective layer 150 from first nanosheet stack 320N entirely, leaving the protective layer 150 over a part of second nanosheet stack 320P. That is, protective layer 150 is removed from first nanosheet stack 320N entirely and is left over first side 332 of second nanosheet stack 320P facing first space 116 and part of upper surface 334 of second nanosheet stack 320P. Consequently, protective layer 150 only protects side 332 and part of upper surface 334 of second nanosheets stack 320P. Protective layer 150 is removed from opposing, second side 336 and the rest of upper surface 334 of second nanosheet stack 320P. Protective layer 150 may also be removed over third and fourth active nanostructures 420P, 420N. Mask 330 may be, for example, 18-23 nm wide. The removal may include using any etching process appropriate for protective layer 150, e.g., a RIE for an oxide. In contrast to the FIGS. 2-8 embodiment and as will be described further, protective layer 150 may remain over side 332 of second active nanostructure 120P, i.e., it need not be removed as in the FIG. 5 embodiment.

Figure 12:
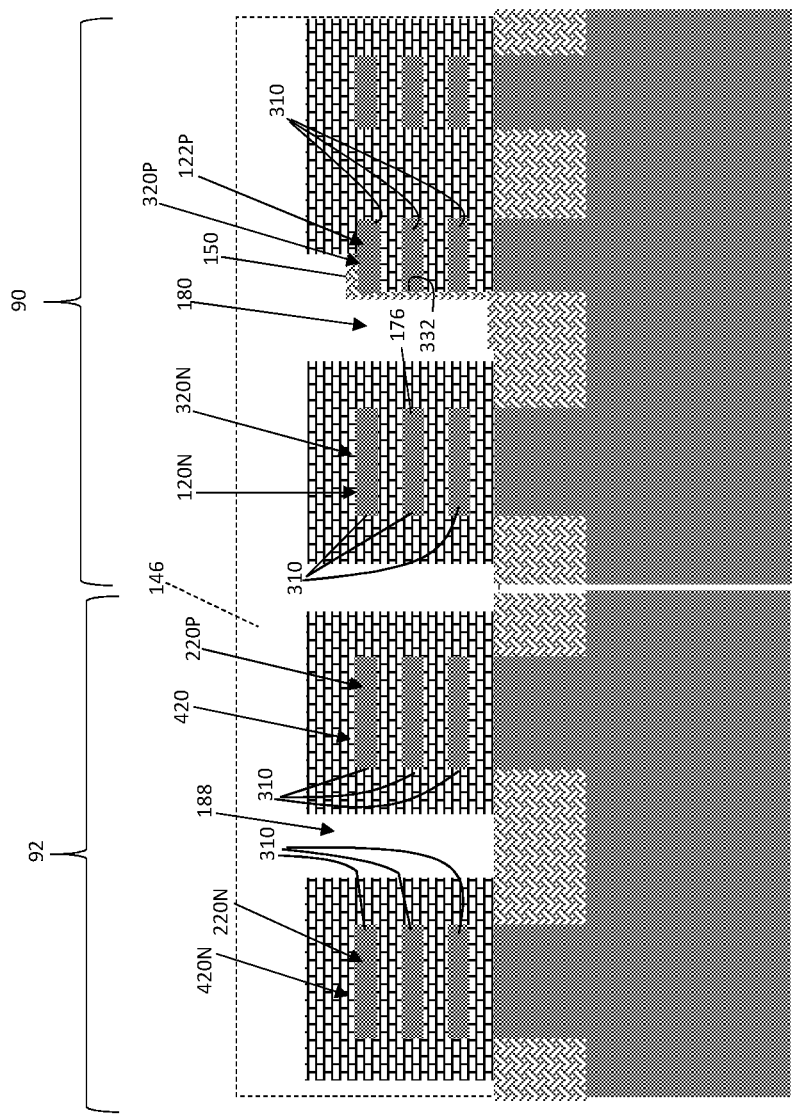
FIG. 12 shows a cross-sectional view of forming of a sacrificial liner over the first active nanostructure, according to other embodiments of the disclosure.

FIG. 12 shows a cross-sectional view of forming sacrificial liner 170 over at least side 176 of first nanosheet stack 320N facing first space 116. Here, sacrificial liner 170 may be formed by epitaxially growing sacrificial material 178 from semiconductor nanosheets 310 of first nanosheet stack 320N. In the example shown, sacrificial material 178 is epitaxially grown over all of first semiconductor nanosheet 330N, and may include the same material as semiconductor nanosheets 310, e.g., silicon germanium. Protective layer 150 prevents epitaxial growth in areas covered thereby, including side 332 and part of upper surface 334 of second active nanosheet stack 320P. As illustrated, sacrificial material 178 may also be formed on any other exposed nanosheet stack, e.g., 420N, 420P in logic region 90.

Figure 13:
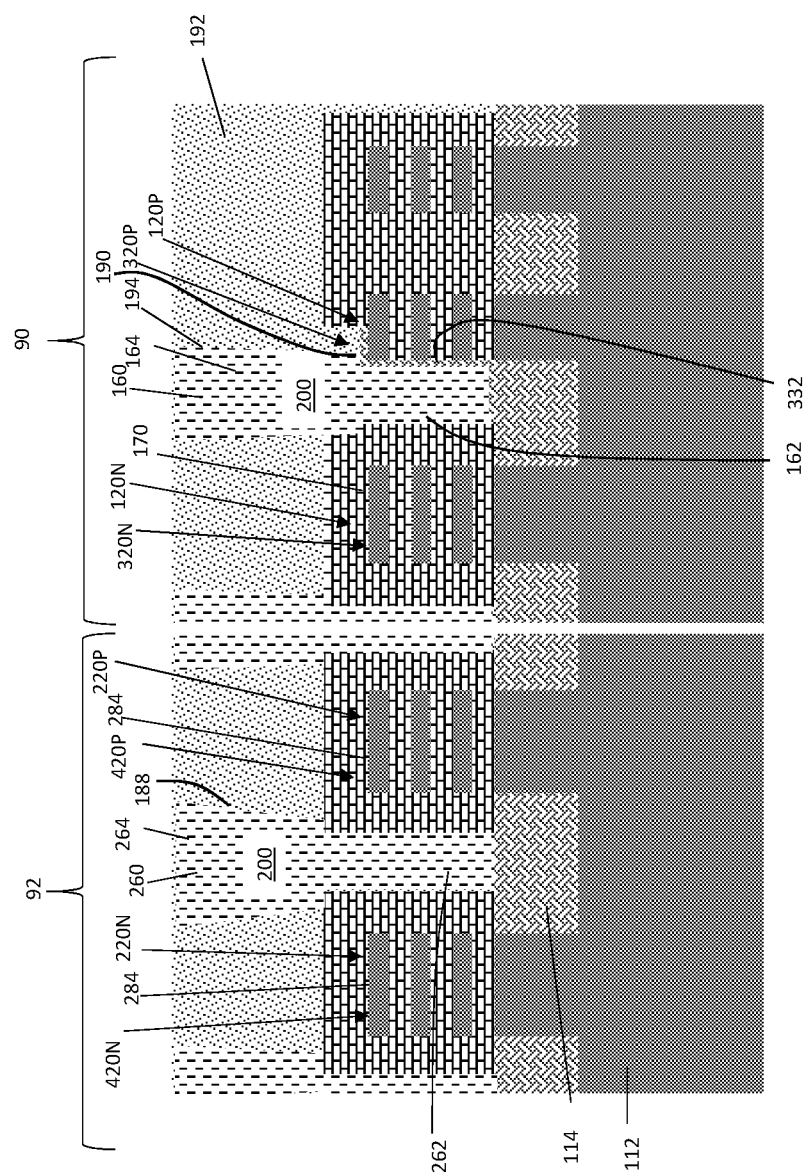
FIG. 13 shows a cross-sectional view of forming gate cut isolations including an asymmetric gate cut isolation in an SRAM region of the IC, according to other embodiments of the disclosure.

FIG. 13 shows a cross-sectional view of one embodiment of forming a gate cut isolation 160 in remaining portion 180 of space 116 (FIG. 12) between first and second active nanostructures 120N, 120P. FIG. 13 also shows forming another gate cut isolation 260 in remaining portion 188 of second space 118 (FIG. 12) between third and fourth active nanostructures 220N, 220P. In this embodiment, dielectric 192 may be deposited, e.g., an oxide, and then patterned and etched to create opening 194 (in SRAM region 90) therein that communicates respectively with remaining portion 180 of first space 116 (FIG. 12). Similarly, dielectric 192 may be patterned and etched to create opening 196 (in logic region 92) therein that communicates with remaining portion 188 of second space 118 (FIG. 12). Openings 194 and 196 are wider than remaining portions 180, 188. Protective layer 150 remains over side 332 of second active nanostructure 120P. Openings 194, 196 and remaining portions 180 and 188 can be filled with a dielectric 200. This process may include depositing dielectric 200, e.g., using CVD. Dielectric 200 may include any of the aforementioned materials. Dielectric 200 fills each opening, creating gate cut isolations 160, 260. In another embodiment, gate cut isolation 160 and/or 260 may be formed using sacrificial columns above each active nanostructure and filling the space with a dielectric, as in related U.S. patent application Ser. No. 16/047,044, filed Jul. 27, 2018. Each gate cut isolation 160 and/or 260 would have substantially similar shapes as shown in FIGS. 13-15.

Gate cut isolation 160 is closer to second active nanostructure 120P than first active nanostructure 120N, i.e., in SRAM region 90. Here, protective layer 150 remains between side 332 of second active nanostructure 120P and gate cut isolation 160. Gate cut isolation 160 has lower portion 162 in remaining portion 180 of first space 116 (FIG. 4) and upper portion 164 extending above upper surface 190 of second active nanostructure 120P. Upper portion 164 and lower portion 162 are unitary and upper portion 164 is wider than lower portion 162. Lower portion 162 may abut protective layer 150, and a portion of upper portion 164 may extend over protective layer 150 and/or upper surface 190 of second active nanostructure 120P. In contrast, gate cut isolation 260 is approximately equidistant from third active nanostructure 220N and fourth active nanostructure 220P, i.e., semiconductor nanosheet stacks 420N, 420P in this embodiment. Gate cut isolation 260 has lower portion 262 in remaining portion 188 of first space 118 (FIG. 12) and upper portion 264 extending above upper surface 284 of third and fourth active nanostructures 220N, 220P. Upper portion 264 and lower portion 262 are unitary and upper portion 264 is wider than lower portion 262. As illustrated, gate cut isolation 260 in logic region 92 may have a T-shape cross-section. Each gate cut isolation 160, 260 may have a height thereof reduced, as desired.

Figure 14:
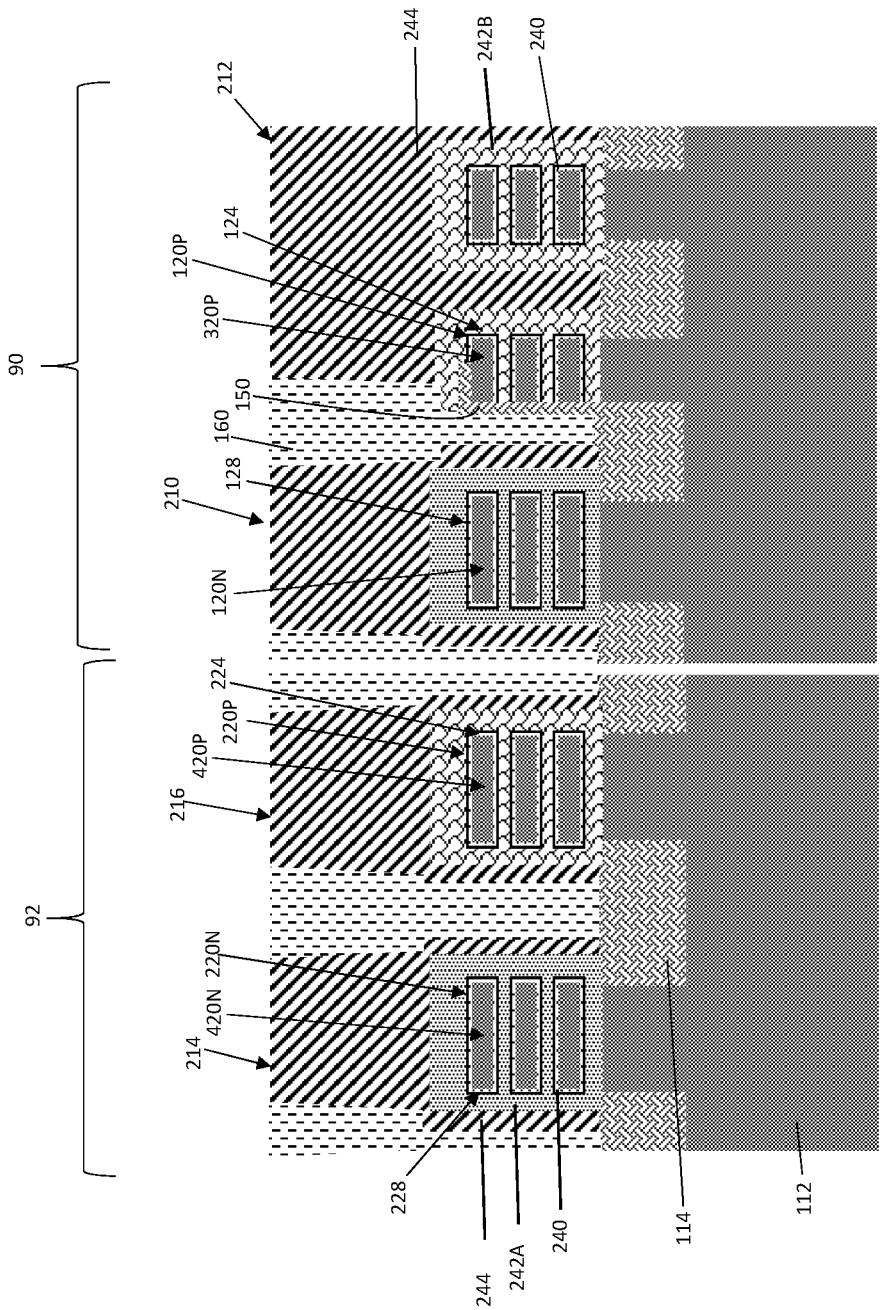
FIG. 14 shows a cross-sectional view of forming gates, according to other embodiments of the disclosure.
Figure 15:
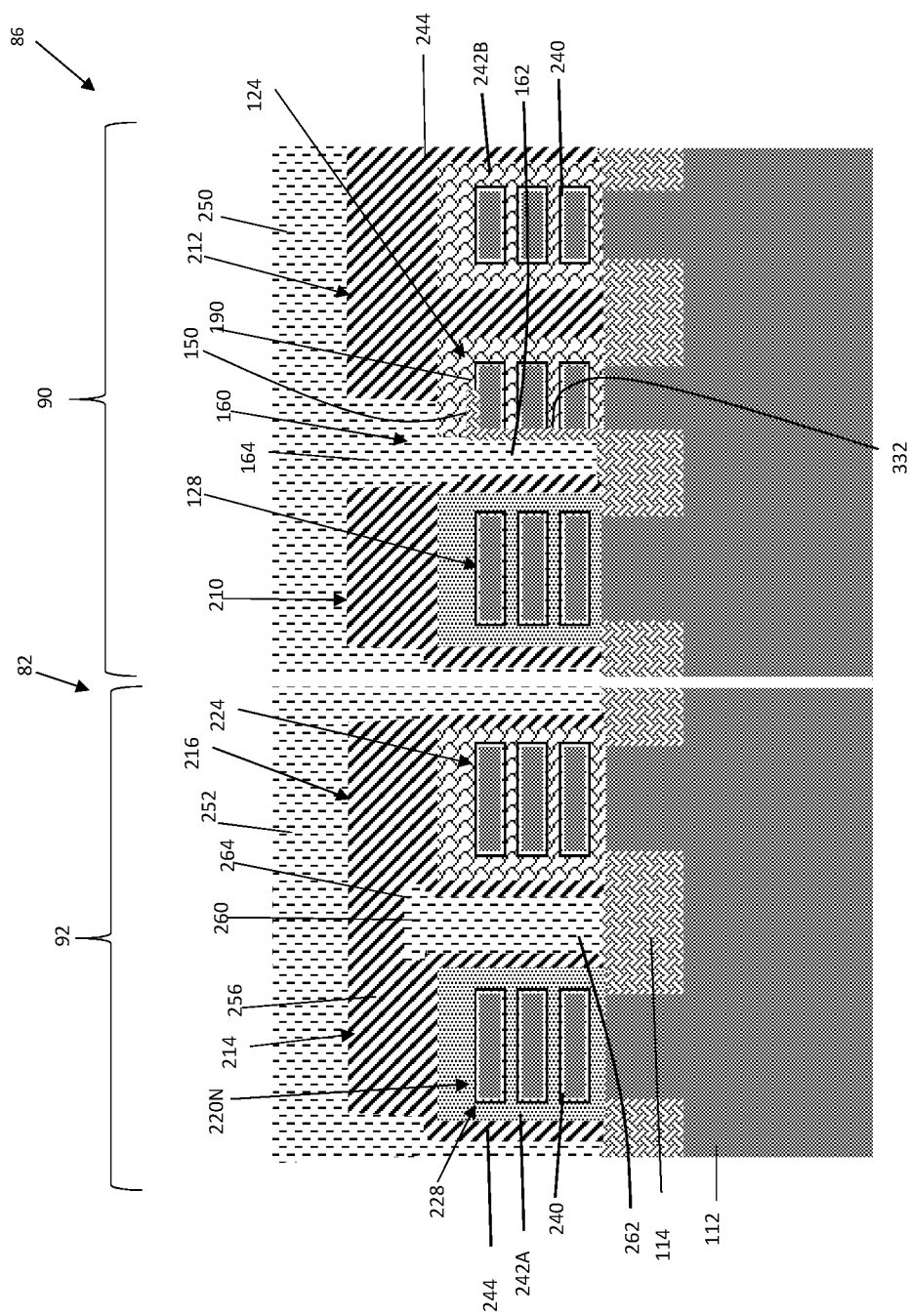
FIG. 15 shows a cross-sectional view of forming a conductive strap in a logic region of the IC, according to other embodiments of the disclosure.

FIGS. 14-15 show cross-sectional views of a number of additional steps. In contrast to FIGS. 7 and 8, in this embodiment, protective layer 150 over side 332 of second active nanostructure 120P need not be removed. FIG. 13 shows removing sacrificial liner 170 (FIG. 13), and forming a first gate 210 over first active nanostructure 120N, and a second gate 212 over second active nanostructure 120P. As illustrated, first gate 212 is separated from second gate 212 by gate cut isolation 160. As understood, gates 210, 212 form FETs 124, 128 (FIG. 1 also) with active nanostructures 120N, 120P, respectively, i.e., with semiconductor nanosheets 310 thereof. FIGS. 14 and 15 also show forming a third gate 214 over third active nanostructure 220P and a fourth gate 216 over fourth active nanostructure 220N. Third and fourth gates 214, 216 are separated by gate cut isolation 260. As understood, gates 214, 216 form FETs 228, 224 (FIG. 1 also) with active nanostructures 220N, 220P, respectively, i.e., with semiconductor nanosheet stacks 420N, 420P. Gates 210, 212, 214, 216 may be formed using any now known or later developed method, as previously described herein. Gates 210, 212, 214, 216 may include any of the high-k metal gate materials previously described herein.

FIG. 15 shows gate cap 250 of, for example, a nitride, over gates 210, 212 in SRAM region 90, and gate cap 252 over gates 214, 216 in logic region 92. FIG. 15 also shows that gates 214, 216 may be optionally electrically coupled by a conductive strap 256 in logic region 92.

FIGS. 8 and 15 show IC 82 according to embodiments of the disclosure. IC 82 includes an SRAM 86. SRAM 86 may be used, for example, to temporarily store data in a computer system in a persistent manner, i.e., without the need for data refresh operations. SRAM 86 may include an array of bit cells, each for retaining a single bit of data during operation. Each SRAM bit cell may include, for example, a six transistor design that includes a pair of cross-coupled inverters and a pair of access transistors connecting the inverters to complementary bit lines. To this end, SRAM 86 may include: NFET 124 having first active nanostructure 120N on substrate 112, and first gate 110 surrounding the first active nanostructure. SRAM 86 also includes PFET 128 having second active nanostructure 120P on substrate 112 adjacent to first active nanostructure 120N of NFET 124, and a second gate 212 surrounding second active nanostructure 120P. SRAM 86 also includes a first gate cut isolation 160 separating first gate 210 from second gate 212, i.e., NFET 124 and PFET 128. First gate cut isolation 160 is closer to second active nanostructure 120P of first PFET 128 than first active nanostructure 120N of first NFET 124, which allows use of cross-couple contact 96 (FIG. 1). Gate cut isolation 160 has lower portion 162 and a unitary, wider, upper portion 164 that extends above upper surface 190 of second active nanostructure 120P of PFET 128. As shown in FIG. 8, in one embodiment, first and second active nanostructures 120N, 120P include semiconductor fins 122N, 122P. As shown in FIG. 15, in another embodiment, first and second active nanostructures 120N, 120P include semiconductor nanosheets 310 separated by gate material (i.e., high-K layer 240, WFM 242A-B, and gate conductor 244). In this embodiment, protective layer 150 may be positioned between gate cut isolation 150 and side 332 of second active nanostructure 120P of PFET 128.

IC 82 may also include logic region 90 including: NFET 228 having a third active nanostructure 220N on substrate 112, and third gate 214 surrounding third active nanostructure 220N. Logic region 90 may also include PFET 224 having fourth active nanostructure 220P on substrate 112 adjacent to third active nanostructure 220N of NFET 228, and fourth gate 216 surrounding fourth active nanostructure 220P. In logic region 90, second gate cut isolation 260 is equidistant between third and fourth active nanostructures 220N, 220P. Also, in logic region 90, conductive strap 256 may be positioned over second gate cut isolation 260 to electrically couple third and fourth gates 214, 216, i.e., NFET 228 and PFET 224.

Embodiments of the disclosure provide methods of forming an asymmetric gate cut isolation to electrically isolate gates of adjacent FETs in a space between active nanostructures of adjacent FETs in an SRAM. A gate extension cross-couple contact that electrically shorts a gate to an adjacent source/drain can be more readily used with this structure compared to a symmetrical gate cut isolation, and without increasing the SRAM cell area requirements. Embodiments of the disclosure do not further restrict additional N-to-P scaling. Embodiments of the disclosure also enable use of the techniques disclosed in related U.S. application Ser. No. 16/047,044 with SRAMs. Accordingly, the present disclosure also enables robust first gate, e.g., PFET gate, formation for gate-all-around active nanostructures at scaled N-to-P spaces, e.g., at 7 nm technology node, required for the later formed second gate, e.g., NFET gate. The teachings of the disclosure also improves integration robustness by relaxing requirements on selected lithographic steps (e.g., from extreme ultraviolet (EUV) techniques to non-EUV techniques) such as: edge placement of a removal mask for a first WFM. With regard to gate cut isolation formation, the disclosure enables gate cut isolation formation (with gates or using replacement metal gate (RMG) processing) with the above-noted relaxed lithographic requirements, and eliminates the need to form tapered devices, e.g., with jogs or corners in the devices to make room for gate cut isolations. Embodiments of the method also provide for self-aligned structures, reducing the impact of edge placement errors. Further, the wider topped gate cut isolation between N and P gates, even where they connect together, provides lower N to P gate parasitic capacitance. Advantageously, embodiments of the disclosure also do not require additional materials.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC), comprising:
 a static random access memory (SRAM) including:
  a first n-type field effect transistor (NFET) having a first active nanostructure on a substrate, and a first gate surrounding the first active nanostructure;
  a first p-type field effect transistor (PFET) having a second active nanostructure on the substrate adjacent to the first active nanostructure of the first NFET, and a second gate surrounding the second active nanostructure; and
  a first gate cut isolation separating the first gate from the second gate, the first gate cut isolation being closer to the second active nanostructure of the first PFET than the first active nanostructure of the first NFET;
 a logic region including:
  a second NFET having a third active nanostructure on the substrate, and a third gate surrounding the third active nanostructure;
  a second PFET having a fourth active nanostructure on the substrate adjacent to the third active nanostructure of the second NFET, and a fourth gate surrounding the fourth active nanostructure; and
  a second gate cut isolation equidistant between the third and fourth active nanostructures.

2. The IC of claim 1, wherein the gate cut isolation includes a lower portion and a unitary, wider, upper portion, the unitary, wider upper portion extending above an upper surface of the second active nanostructure of the first PFET.

3. The IC of claim 1, wherein the first and second active nanostructures include semiconductor nanosheets separated by gate material, and further comprising a protective layer positioned between the gate cut isolation and a side of the second active nanostructure of the first PFET.

4. The IC of claim 1, wherein the first and second active nanostructures each include a semiconductor fin.

5. The IC of claim 1, wherein the first and second active nanostructures each include a semiconductor nanosheet stack.

6. The IC of claim 1, further comprising a conductive strap positioned over the second gate cut isolation to electrically couple the third and fourth gates.

7. An static random access memory (SRAM), comprising:
   an n-type field effect transistor (NFET) having a first active nanostructure on a substrate, and a first gate surrounding the first active nanostructure;
   a p-type field effect transistor (PFET) having a second active nanostructure on the substrate adjacent to the first active nanostructure of the NFET, and a second gate surrounding the second active nanostructure; and
   a gate cut isolation separating the first gate from the second gate, the gate cut isolation being closer to the second active nanostructure of the PFET than the first active nanostructure of the NFET;
   a logic region including:
      a second NFET having a third active nanostructure on the substrate, and a third gate surrounding the third active nanostructure;
      a second PFET having a fourth active nanostructure on the substrate adjacent to the third active nanostructure of the second NFET, and a fourth gate surrounding the fourth active nanostructure; and
      a second gate cut isolation equidistant between the third and fourth active nanostructures.

8. The SRAM of claim 7, wherein the gate cut isolation includes a lower portion, and a unitary, wider, upper portion, the unitary, wider, upper portion extending above an upper surface of the second active nanostructure of the PFET.

9. The SRAM of claim 8, wherein the first and second active nanostructures include semiconductor nanosheets separated by gate material, and further comprising a protective layer positioned between the lower portion of the gate cut isolation and a side of the second active nanostructure of the PFET.

10. The SRAM of claim 7, wherein the first and second active nanostructures include semiconductor nanosheets separated by gate material, and further comprising a protective layer positioned between the gate cut isolation and a side of the second active nanostructure of the PFET.

\* \* \* \* \*